(12) United States Patent
Ikenaga et al.

(10) Patent No.: US 6,897,549 B2
(45) Date of Patent: May 24, 2005

(54) FRAME FOR SEMICONDUCTOR PACKAGE

(75) Inventors: Chikao Ikenaga, Tokyo (JP); Kouji Tomita, Tokyo (JP)

(73) Assignee: Dainippon Printing Co., Ltd., Tokyo (JP)

( * ) Notice: Subject to any disclaimer, the term of this patent is extended or adjusted under 35 U.S.C. 154(b) by 0 days.

(21) Appl. No.: 10/340,943

(22) Filed: Jan. 13, 2003

(65) Prior Publication Data

US 2003/0098503 A1 May 29, 2003

Related U.S. Application Data

(63) Continuation of application No. 09/850,211, filed on May 7, 2001, now abandoned.

(30) Foreign Application Priority Data

May 9, 2000 (JP) ........................................ 2000-135337

(51) Int. Cl.[7] ............................................ H01L 23/495
(52) U.S. Cl. ...................... 257/666; 257/669; 257/673; 257/676; 257/773; 257/787; 257/797
(58) Field of Search ................................ 257/666, 669, 257/673, 676, 787, 797, 773

(56) References Cited

U.S. PATENT DOCUMENTS

| | | |
|---|---|---|
| 4,862,246 A | 8/1989 | Masuda et al. |
| 4,868,635 A | 9/1989 | Frechette et al. |
| 4,924,291 A | 5/1990 | Lesk et al. |
| 4,994,895 A | 2/1991 | Matsuzaki et al. |
| 5,424,576 A * | 6/1995 | Djennas et al. ............. 257/666 |
| 5,610,437 A * | 3/1997 | Frechette ..................... 257/670 |
| 5,847,930 A | 12/1998 | Kazle |
| 6,239,480 B1 * | 5/2001 | MacPherson et al. ....... 257/676 |
| 6,242,281 B1 | 6/2001 | Mclellan et al. |
| 6,300,224 B1 | 10/2001 | Arima et al. |
| 6,400,004 B1 * | 6/2002 | Fan et al. .................... 257/666 |
| 6,489,218 B1 * | 12/2002 | Kim et al. ................... 438/460 |
| 6,744,118 B2 * | 6/2004 | Ikenaga et al. ............. 257/666 |
| 2001/0030355 A1 | 10/2001 | Mclellan et al. |

* cited by examiner

Primary Examiner—Allan R. Wilson
Assistant Examiner—Edgardo Ortiz
(74) Attorney, Agent, or Firm—Flynn, Thiel, Boutell & Tanis, P.C.

(57) ABSTRACT

A frame for a semiconductor package has die-pads supported with suspending leads of individual lead frames. Semiconductor devices are arranged on the die-pads. These semiconductor devices are collectively molded with molding compound, and then the collectively molded semiconductor packages are cut into individual packages by means of a dicing saw. In the frame, suspending leads are formed into fish tails, wherein at least one of a longitudinal grid-lead and a transverse grid-lead is eliminated within areas enclosed with fish tails of the suspending leads. Accordingly, whether an R-shape generated by producing the frame by etching is large or small, the existence of metal pieces at the edges of the semiconductor packages is substantially prevented.

6 Claims, 8 Drawing Sheets

FRAME FOR SEMICONDUCTOR PACKAGE

CROSS REFERENCE TO RELATED APPLICATION

This is a continuation of application Ser. No. 09/850,211, filed on May 7, 2001, now abandoned.

BACKGROUND OF THE INVENTION

1. Field of the Invention

The present invention relates to a frame for a semiconductor package in which a semiconductor device is mounted on a lead frame and the outside thereof, particularly the upper surface of the semiconductor device, is encapsulated with molding compound.

2. Description of the Prior Art

In recent years, it has been necessary to miniaturize and shape semiconductor products mounted on a substrate so as to be thinner, since the packaging of the semiconductor is more dense. It has been required for LSI to reduce the number of chips by improving integration level and to miniaturize and make a package lighter. The popularization of so-called CSP (Chip Size Package) is rapidly advancing. Particularly, in the development of a thin semiconductor product with a lead frame, the semiconductor package of the single side encapsulation type has been developed in which a semiconductor device is mounted on a lead frame and the surface of semiconductor device mounted on a lead frame is encapsulated with molding compound.

FIG. 1 is a sectional view of one example of a semiconductor package. FIG. 2 is a plan view thereof. The semiconductor package shown in FIGS. 1 and 2 is comprised of a lead frame 1, a semiconductor device 4 mounted on a die-pad 3 supported with suspending leads 2 of lead frame 1, metallic thin wires 6 for electrically connecting electrodes provided on the top face of the semiconductor device 4 with terminals 5 of lead frame 1, and molding compound 7 for encapsulating the outside region of semiconductor device 4 including the upper side of semiconductor device 4 and the lower side of die-pad 3. The semiconductor package is of the non-lead type in which so-called outer leads do not project from the semiconductor package and the two inner leads and outer leads are integrated into terminals 5, wherein the lead frame 1 is half-cut by etching or is half-etched in such a manner that die-pad 3 is positioned higher than terminals 5. Since a step is formed between die pad 3 and terminals 5, molding compound 7 can be inserted into the lower side of die-pad 3 so that a thin semiconductor package can be realized even though the semiconductor package has a non-exposed die-pad.

Since the semiconductor device is miniature, a matrix type frame is mainly used for the above-mentioned semiconductor package of the non-lead type, in which plural semiconductor devices are arranged in a direction of a width of the matrix type frame. Further, recently, due to a demand for lower cost, a switch from a frame of the individually molded type shown in FIGS. 3A and 3B to a frame of the collectively molded type shown in FIGS. 4A and 4B is occurring.

In the frame of the individually molded type, as shown in FIG. 3(A), individual molding cavities C of a small size are provided separately within a frame F. After molding, individual semiconductor packages are stamped out so that semiconductor packages S shown in FIG. 3(B) are obtained. Namely, semiconductor devices are mounted on die-pads of lead frames through silver paste and others, and wire bonding is carried out. Thereafter, the respective semiconductor devices are individually molded with molding compound and the respective molded semiconductor devices are stamped out to form individual semiconductor packages.

In the frame of the collectively molded type, as shown in FIG. 4(A), some molding cavities C of large size are provided within a frame F. Multiple semiconductor devices are arranged in a matrix within each molding cavity C, and are respectively and collectively molded with molding compound. Thereafter, the collectively molded semiconductor devices are cut at grid-leads L by means of a dicing saw so that a semiconductor package S shown in FIG. 4(B) is obtained. Namely, semiconductor devices are mounted on die-pads of lead frames through silver pastes and others and wire bonding is carried out. Thereafter, plural semiconductor devices are collectively molded with molding compound to a given cavity size, and then the collectively molded semiconductor devices are cut to form individual semiconductor packages by dicing.

In the above-mentioned semiconductor package of; the collectively molded type, heat generated in the semiconductor device is transmitted through a die-pad to suspending leads, in which there is a case where suspending leads come off from the molded resin due to a difference in the thermal expansion coefficient between metal and resin. Therefore, in order to prevent the coming-off of the suspending leads, the suspending leads are formed with projection portions, or as shown in FIG. 2, the tips of suspending leads are formed into a forked shape, or a so-called fish tail shape.

Generally, in case of producing products by etching, parts designed to form a right angle are finished to have a roundish or rounded shape (R-shape), no matter how the etching process is carried out. In a frame for a semiconductor package of the collectively molded type having suspending leads formed into a fish tail shape, the R-shape formed by etching is also seen. For example, even if suspending leads 2 having a fish tail shape are designed as shown in FIG. 5, etched products have the R-shape as shown by the dotted line.

Semiconductors are mounted on the frame F for the semiconductor package of the collectively molded type, collectively molded, and are thereafter divided into individual semiconductor packages by dicing. At this time, if the roundish part of the R-shape does not come to the dicing line α, there is no problem. However, if the roundish part of the R-shape comes to the dicing line a, because of the large R-shape, as shown in FIG. 6, a metal piece 8 of grid-lead L is left at an edge of the individual semiconductor package. Further, in a few cases, when mounting a semiconductor product on a substrate, the metal piece 8 comes off of the molded resin and drops down on the substrate, so that accidental short-circuiting is likely to occur.

BRIEF SUMMARY OF THE INVENTION

An object of the present invention is to provide a frame for a semiconductor package of the collectively molded type used for the production of a semiconductor package, in which the frame for the semiconductor package is formed in such a manner so that a metal piece is not left at the edges of the semiconductor device after dicing.

In order to achieve the above-mentioned object, a frame for a semiconductor package of the present invention comprises plural lead frames arranged in a matrix through grid-leads, in which the individual semiconductor devices are mounted on die-pads supported with suspending leads of the individual lead frames, respectively, the semiconductor devices are collectively molded with molding compound and the collectively molded semiconductor devices are cut at the grid-leads by means of a dicing saw to obtain individual semiconductor packages, wherein the suspending leads are formed into fish tails and at least one of a longitudinal grid-lead and a transverse grid-lead is eliminated within areas enclosed with fish tails of the suspending leads.

DETAILED DESCRIPTION

Figure 1:
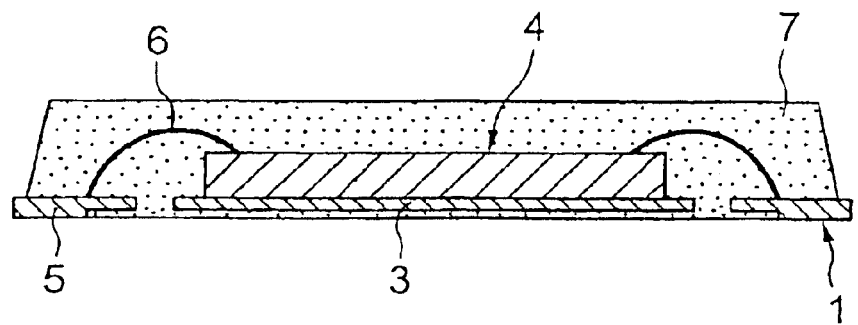
FIG. 1 is a sectional view of one example of a semiconductor package.
Figure 2:
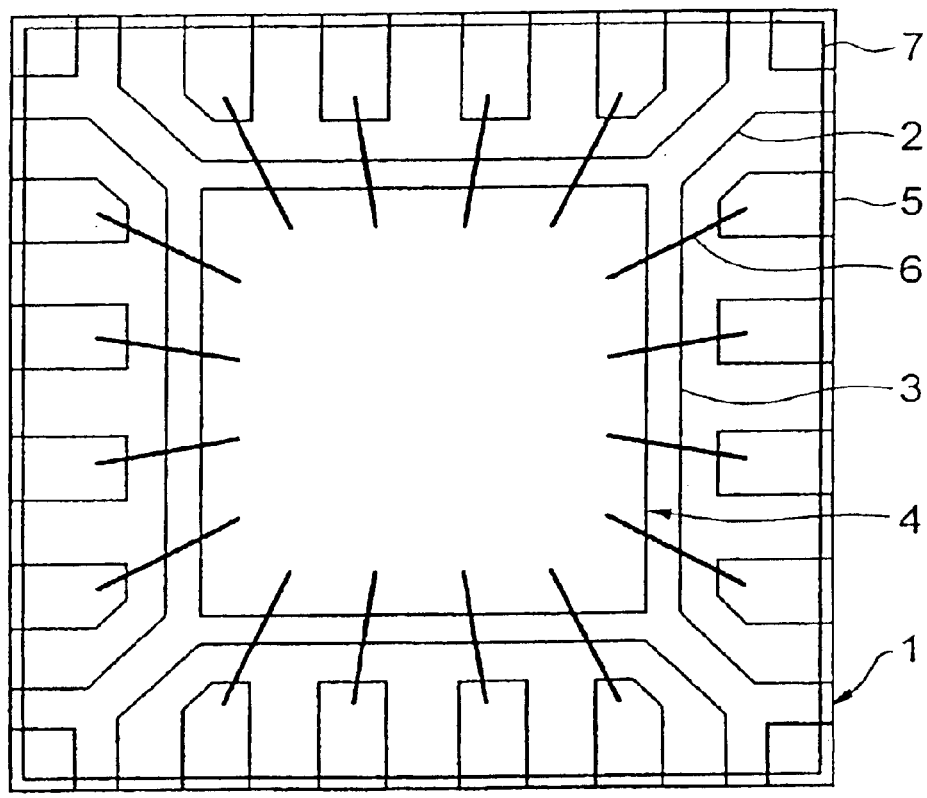
FIG. 2 is a plan view of the semiconductor package shown in FIG. 1.
Figure 3A:
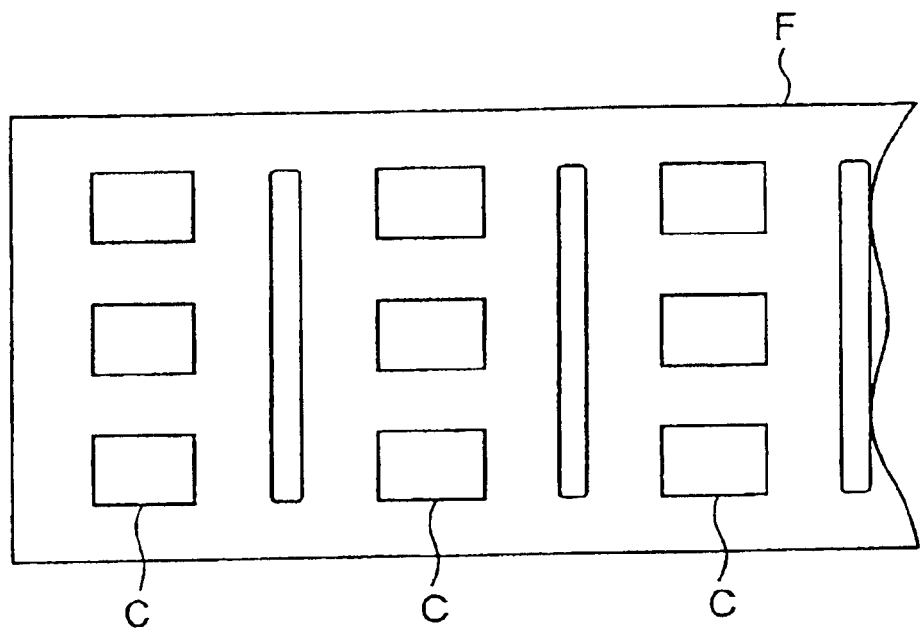
FIGS. 3(A) and 3(B) are explanatory views of a frame of the individually molded type.
Figure 3B:
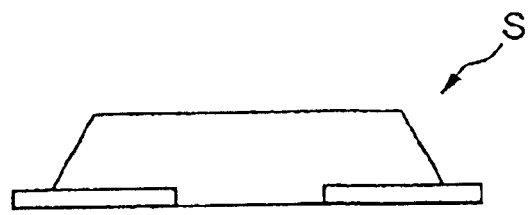
Figure 4A:
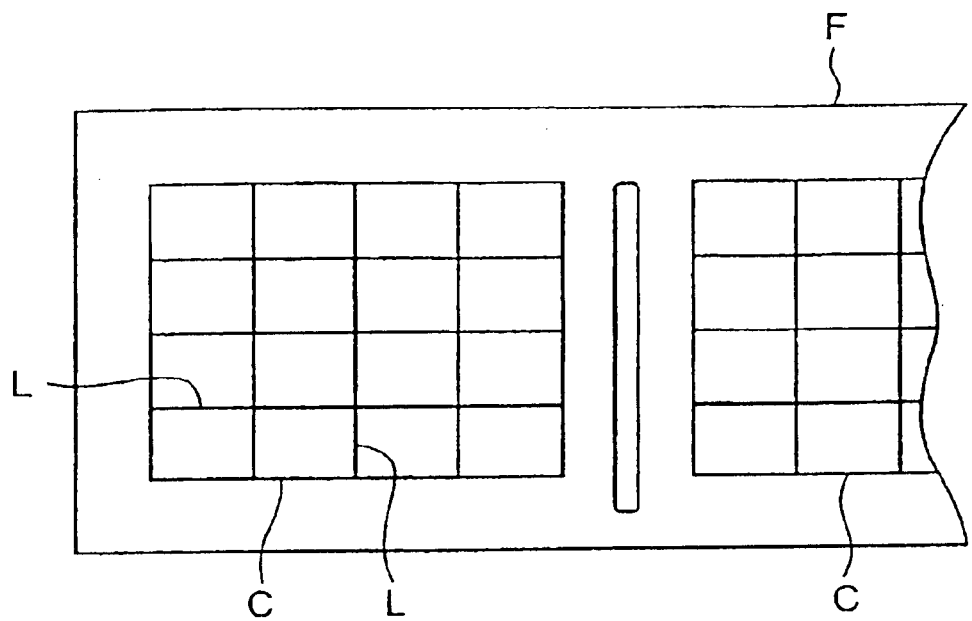
FIGS. 4(A) and 4(B) are explanatory views of a frame of the collectively molded type.
Figure 4B:
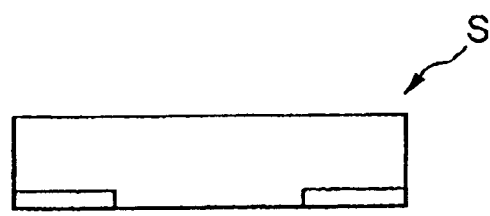
Figure 5:
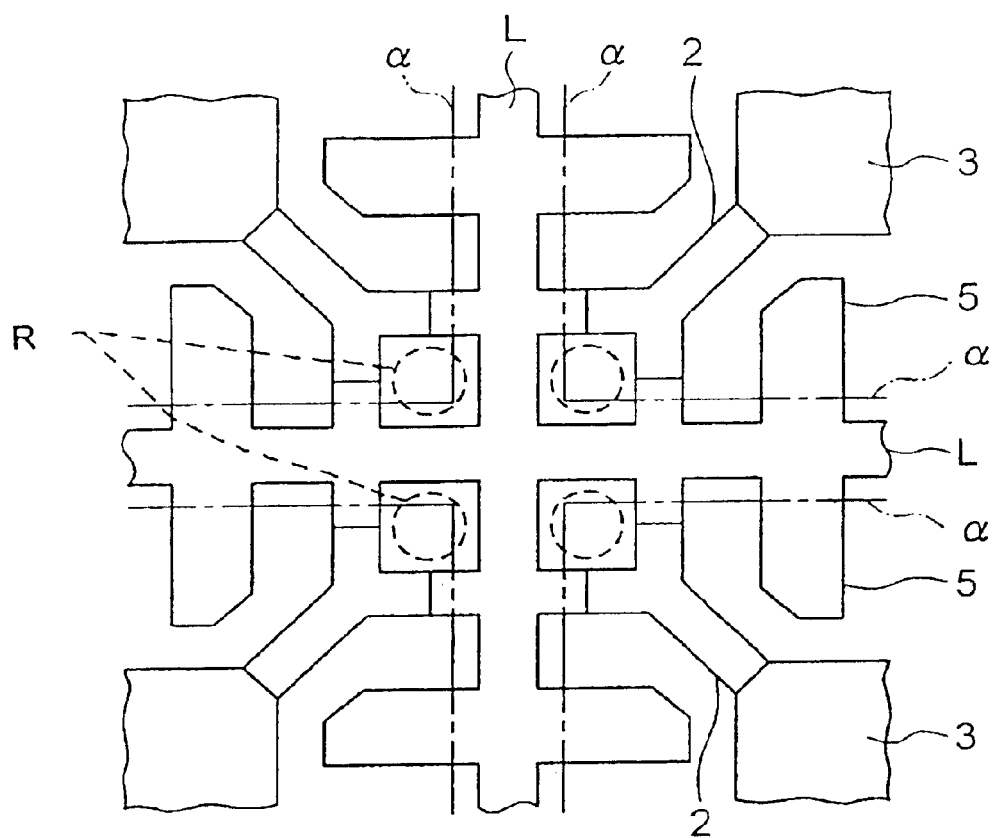
FIG. 5 is an explanatory view of the R-shape generated by etching.
Figure 6:
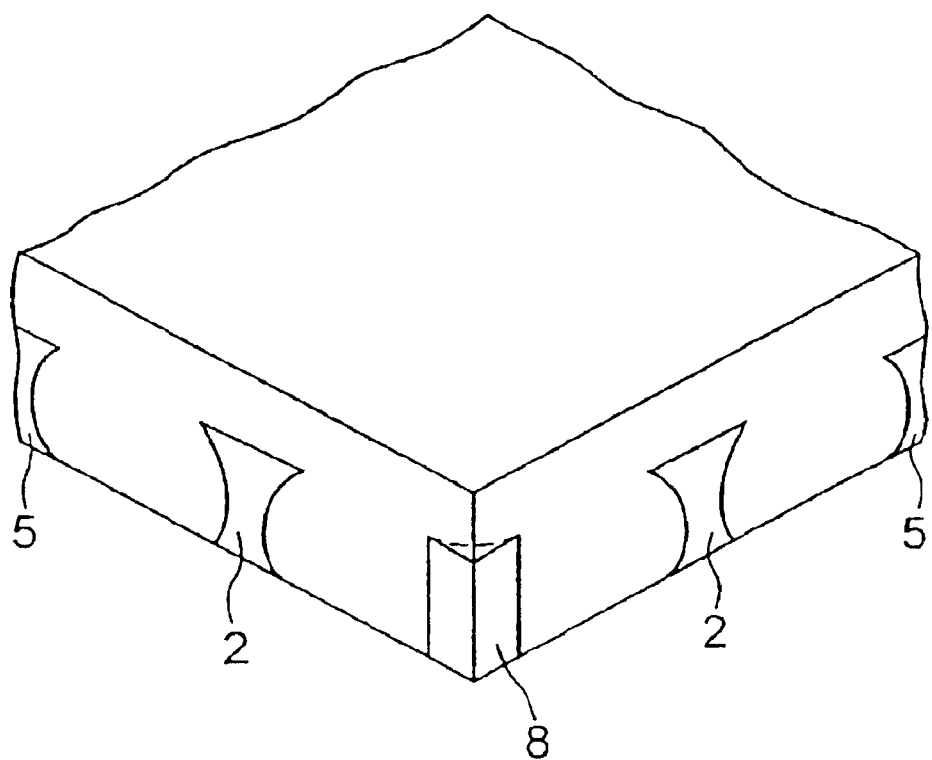
FIG. 6 is an explanatory view showing a state where a metal piece is left at the edges of the semiconductor package.
Figure 7:
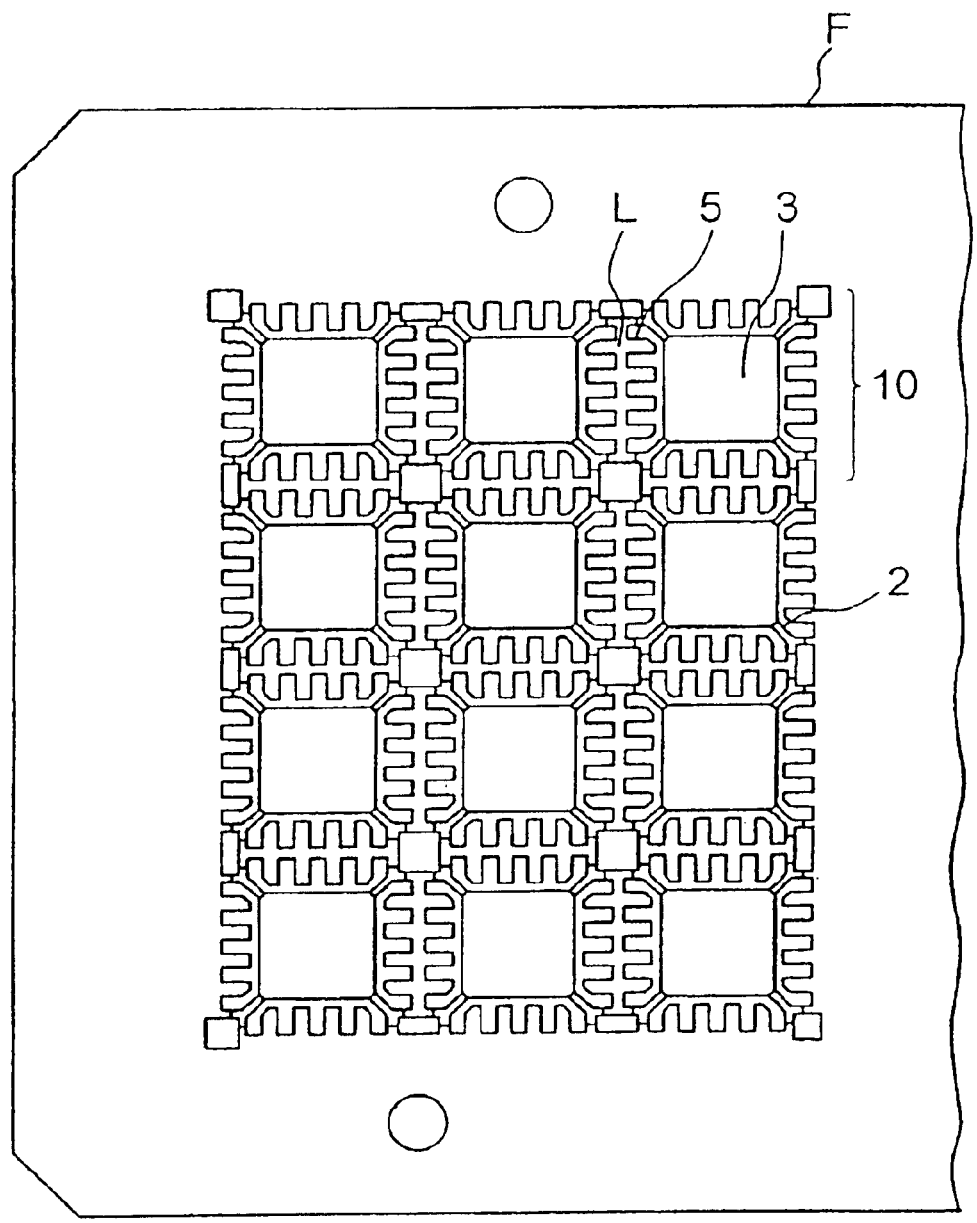
FIG. 7 is a plan view of one example of the present invention.
Figure 8:
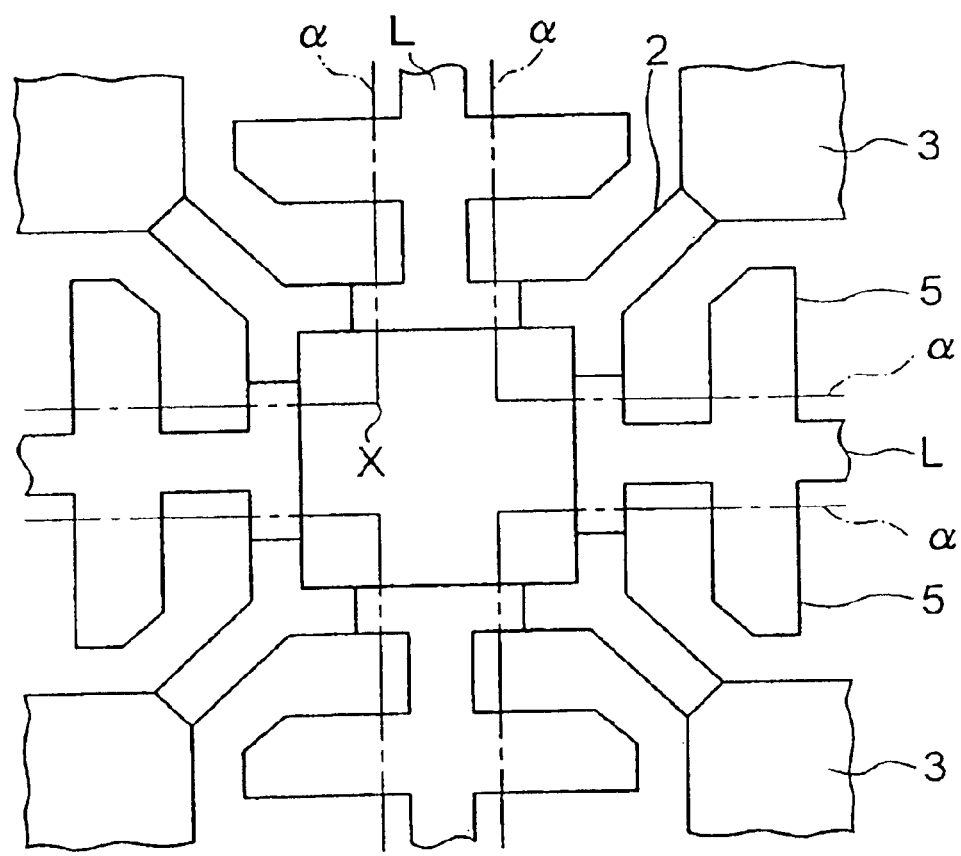
FIG. 8 is a partial enlarged view of the frame shown in FIG. 7.

Then, referring to the figures, embodiments of the present invention are explained. FIG. 7 is a plan view of one example of a frame of the present invention. FIG. 8 is a partial enlarged plan view of the frame.

In these figures, F designates a metal frame for lead frames, in which lead frames 10 are arranged in a matrix of 3×4 through grid-leads L. The grid-leads L connect terminals 5 of adjacent lead frames 10 with each other. In each lead frame 10, die-pad 3 is supported with suspending leads 2. Further, suspending leads 2 are formed into a fish tail and both the longitudinal grid-lead L and the transverse grid-lead L are eliminated within areas enclosed within the fish tails of the suspending leads 2.

A process for producing semiconductor packages using the frame F is as follows. First, semiconductor devices are mounted on die-pads 3 of the respective lead frames 10 of frame F through silver pastes, and wire bonding is made between terminals 11 of the lead frames and electrodes provided on the top face of the semiconductor devices. Thereafter, twelve semiconductor devices are collectively molded with molding compound to a given cavity size and then the collectively molded semiconductor devices are cut at grid-leads L by means of a dicing paw in such a manner that terminals 5 of individual lead frames are left, by which the collectively molded semiconductor devices are divided into individual semiconductor packages. In this dicing, edges of the semiconductor package are formed with resin cut into an orthogonal shape, since nothing exists except molded resin at edges X of each semiconductor device.

Figure 9:
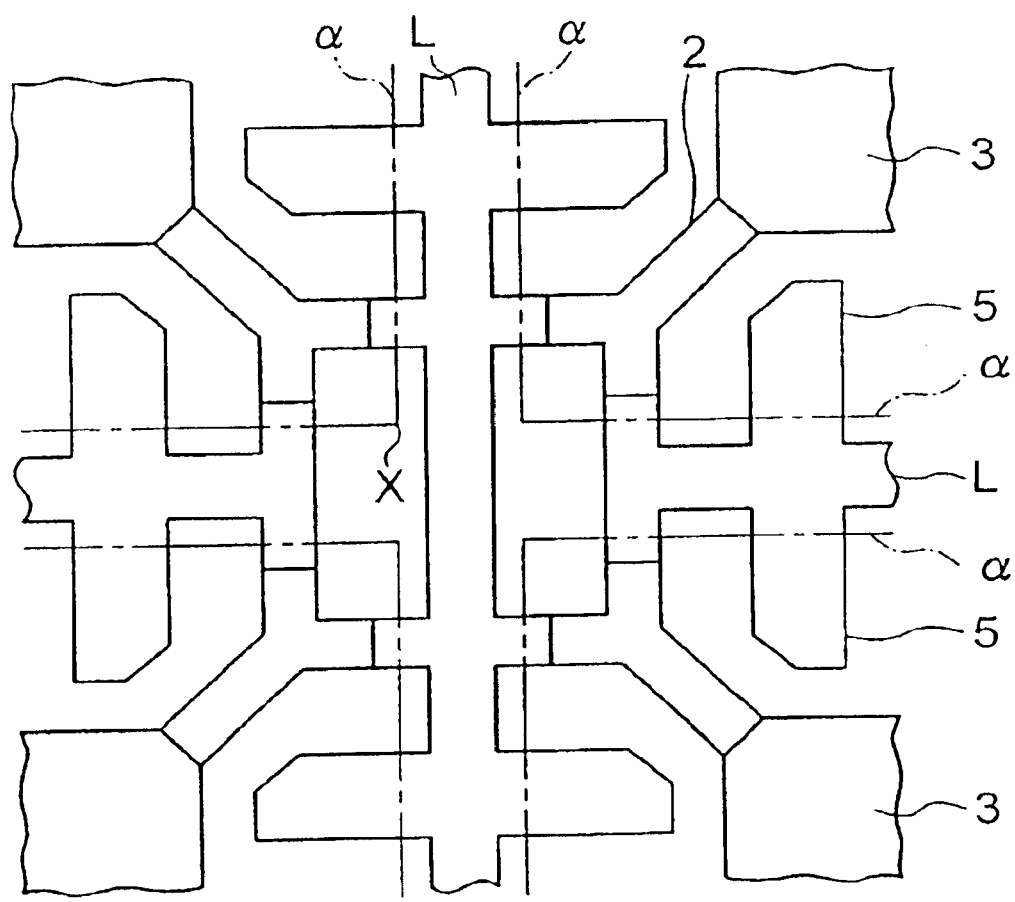
FIG. 9 is a sectional view of another example of frame shown corresponding to FIG. 8.

FIG. 9 is a partial enlarged plan view of another example shown corresponding to FIG. 8.

In this case, transverse grid-lead L is eliminated within areas enclosed with fish tails of suspending leads 2. Semiconductor devices are mounted on the frame F for semiconductor packages and collectively molded with molding compound. Thereafter, the collectively molded semiconductor devices are cut at dicing lines a by means of a dicing saw to form individual semiconductor packages. Even though longitudinal grid-lead L exists outward at each edge X of the individual semiconductor package, this part is not roundish. Therefore, edges of the semiconductor package are formed with resin cut into an orthogonal shape.

As mentioned above, a frame for a semiconductor package of the present invention comprises plural lead frames arranged in a matrix through grid-leads, in which individual semiconductor devices are mounted on die-pads supported with suspending leads of the individual lead frames, respectively, the semiconductor devices are collectively molded with molding compound and the collectively molded semiconductor devices are cut at grid-leads by means of a dicing saw to obtain individual semiconductor packages, wherein the suspending leads are formed into fish tails and at least one of the longitudinal grid-lead and the transverse grid-lead is eliminated within areas enclosed with fish tails of the suspending leads. Accordingly, whether the R-shape generated by producing the frame for the semiconductor package by etching is large or small, metal pieces at the edges of the semiconductor packages in dicing becomes almost nothing. Accordingly, when mounting semiconductor products on a substrate, there is no case where a metal piece drops out on the substrate, which can cause short circuiting.

What is claimed is:

1. A frame from which individual semiconductor packages are formed comprising an array of lead frames, each said lead frame including a die pad and a semiconductor device which is at least partially encapsulated in molding compound and mounted on said die pad, longitudinally and transversely oriented metal leads disposed in a grid formation and interconnecting the lead frames to one another, said longitudinal and transverse leads defining boundaries between the respective lead frames whereby cutting along predetermined longitudinal and transverse cut lines disposed adjacent the respective longitudinal and transverse leads results in individual semiconductor packages, each said lead frame having suspending leads which support the respective die pad and each suspending lead having an outer end with a generally forked-shaped configuration defined by a pair of spaced-apart legs, wherein a plurality of said lead frames are directly connected to one another and define an area therebetween which is bordered by said forked-shaped ends of said directly connected lead frames, and one of said longitudinal lead and said transverse lead is eliminated within each of said areas such that said areas are void of metal and no metal pieces are left at the corners of the individual semiconductor packages formed after cutting along the longitudinal and transverse cut lines.

2. The frame of claim 1 wherein said areas between said directly connected lead frames consist solely of molding compound.

3. The frame of claim 1 wherein both said longitudinal lead and said transverse lead are eliminated within each of the respective areas, each said area being bordered by four forked-shaped outer ends of four of said directly connected lead frames.

4. The frame of claim 1 wherein only said transverse leads are eliminated within the respective areas, each said area being defined between and bordered by two forked-shaped outer ends of two of said directly connected lead frames disposed on the same side of one of said longitudinal leads.

5. The frame of claim 4 wherein each said area is bordered on one side by said two forked-shaped outer ends, and on an opposite side by a portion of said one longitudinal lead, said area extending beyond longitudinal cut lines corresponding to said two directly connected lead frames.

6. The frame of claim 1 wherein said longitudinal and transverse leads interconnect terminals of adjacent lead frames to one another prior to cutting.

* * * * *